United States Patent
Aoki (10) Patent No.: US 9,406,366 B2
(45) Date of Patent: Aug. 2, 2016

(54) SEMICONDUCTOR MEMORY DEVICE AND METHOD OF CONTROLLING SEMICONDUCTOR MEMORY DEVICE

(71) Applicant: FUJITSU LIMITED, Kawasaki-shi, Kanagawa (JP)

(72) Inventor: Masaki Aoki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/570,345

(22) Filed: Dec. 15, 2014

(65) Prior Publication Data

US 2015/0206565 A1 Jul. 23, 2015

(30) Foreign Application Priority Data

Jan. 23, 2014 (JP) ................................. 2014-010632

(51) Int. Cl.
*G11C 11/00* (2006.01)
*G11C 11/16* (2006.01)
*G11C 11/15* (2006.01)

(52) U.S. Cl.
CPC ........ *G11C 11/1673* (2013.01); *G11C 11/1697* (2013.01); *G11C 11/15* (2013.01)

(58) Field of Classification Search
CPC .................. G11C 13/004; G11C 16/26; G11C 2013/0054; G11C 11/1659; G11C 11/1697; G11C 11/1673; G11C 11/4091; G11C 11/419; G11C 16/28; G11C 13/003; G11C 14/0081; G11C 11/14–11/16; G11C 5/147
USPC ............. 365/158, 189.011, 189.07, 196, 207, 365/209, 210.1, 210.12, 210.15, 213, 225.5, 365/243.5

See application file for complete search history.

(56) References Cited

U.S. PATENT DOCUMENTS

| | | | | |
|---|---|---|---|---|
| 6,594,777 | B1 * | 7/2003 | Takata | ...................... G06F 8/66 365/200 |
| 7,881,094 | B2 * | 2/2011 | Chen | ...................... G11C 5/147 365/100 |
| 2003/0081453 | A1 | 5/2003 | Hidaka | |
| 2003/0230733 | A1 | 12/2003 | Tanaka | |
| 2004/0017718 | A1 | 1/2004 | Ooishi | |
| 2004/0100835 | A1 * | 5/2004 | Sugibayashi | .......... G11C 11/16 365/200 |
| 2006/0227598 | A1 * | 10/2006 | Sakimura | ........... G11C 11/1673 365/158 |
| 2010/0238736 | A1 * | 9/2010 | Kamata | .............. G11C 16/3436 365/185.21 |

(Continued)

FOREIGN PATENT DOCUMENTS

| | | |
|---|---|---|
| JP | 2003-203474 | 7/2003 |
| JP | 2004-020325 | 1/2004 |
| JP | 2004-062922 | 2/2004 |

*Primary Examiner* — Son Dinh
*Assistant Examiner* — Uyen B Tran
(74) *Attorney, Agent, or Firm* — Fujitsu Patent Center (57) ABSTRACT

A semiconductor memory device includes a memory cell, a reference cell, a first current source configured to cause a first current to flow through the memory cell, a second current source configured to cause a second current having an amount thereof being variable to flow through the reference cell, a sense amplifier configured to compare a voltage responsive to a voltage drop across the memory cell with a voltage responsive to a voltage drop across the reference cell, and a current-amount setting circuit configured to determine the amount of the second current, wherein the current-amount setting circuit determines the amount of the second current such that the voltage drop across the reference cell is equal to a midpoint between the voltage drop across the memory cell having a data value of "0" stored therein and the voltage drop across the memory cell having a data value of "1" stored therein.

5 Claims, 11 Drawing Sheets

(56) References Cited

U.S. PATENT DOCUMENTS

2011/0080775 A1* 4/2011 Bae .......................... G11C 7/04
  365/163
2011/0255347 A1* 10/2011 Mori ........................ G11C 7/18
  365/185.25
2011/0267893 A1* 11/2011 Kato ....................... G11C 16/06
  365/185.22

* cited by examiner

| INPUT | | OUTPUT | | | |
|---|---|---|---|---|---|
| VLOAD_REG<0> | VLOAD_REG<1> | TRIM<3> | TRIM<2> | TRIM<1> | TRIM<0> |
| 0 | 0 | 0 | 0 | 0 | 1 |
| 0 | 1 | 0 | 0 | 1 | 1 |
| 1 | 0 | 0 | 1 | 1 | 1 |
| 1 | 1 | 1 | 1 | 1 | 1 |

SEMICONDUCTOR MEMORY DEVICE AND METHOD OF CONTROLLING SEMICONDUCTOR MEMORY DEVICE

CROSS-REFERENCE TO RELATED APPLICATIONS

The present application is based upon and claims the benefit of priority from the prior Japanese Patent Application No. 2014-010632 filed on Jan. 23, 2014, with the Japanese Patent Office, the entire contents of which are incorporated herein by reference.

FIELD

The disclosures herein relate to a semiconductor memory device and a method of controlling a semiconductor memory device.

BACKGROUND

Certain types of semiconductor memories store information therein by creating a change in the resistance value of a memory cell. Flash memories and spin-transfer torque MRAMs (magnetoresistive random access memories) are examples of such types of semiconductor memories. Data reading is performed by causing read currents to flow through a memory cell and a reference cell, respectively, to compare a voltage drop across the memory cell with a voltage drop across the reference cell, thereby detecting whether the data of the memory cell is "0" or "1".

The resistance value of a reference cell is ideally set equal to a midpoint resistance value between the high resistance value of a memory cell corresponding to one of "0" and "1" and the low resistance value of a memory cell corresponding to the other one of "0" and "1". Product variation may cause the resistance value of a reference cell to deviate from the midpoint resistance value to come close to either the high resistance value or the low resistance value of a memory cell, resulting in a narrow read margin. The narrow read margin entails a lengthy time for comparison and detection of voltage drops and a failure to detect correct data in some cases.

[Patent Document 1] Japanese Laid-open Patent Publication No. 2003-203474
[Patent Document 2] Japanese Laid-open Patent Publication No. 2004-20325
[Patent Document 3] Japanese Laid-open Patent Publication No. 2004-62922

SUMMARY

According to an aspect of the embodiment, a semiconductor memory device includes a memory cell, a reference cell, a first current source configured to cause a first current to flow through the memory cell, a second current source configured to cause a second current having an amount thereof being variable to flow through the reference cell, a sense amplifier configured to compare a voltage responsive to a voltage drop across the memory cell with a voltage responsive to a voltage drop across the reference cell, and a current-amount setting circuit configured to determine the amount of the second current, wherein the current-amount setting circuit determines the amount of the second current such that the voltage drop across the reference cell is set equal to a midpoint between the voltage drop across the memory cell having a data value of "0" stored therein and the voltage drop across the memory cell having a data value of "1" stored therein.

A method of controlling a semiconductor memory device includes causing a first current to flow through a memory cell, causing a second current to flow through a reference cell, comparing a voltage responsive to a voltage drop across the memory cell with a voltage responsive to a voltage drop across the reference cell, adjusting an amount of the second current in response to a result of the comparing, and storing data indicative of the adjusted amount in a nonvolatile resister.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings. In these drawings, the same or corresponding elements are referred to by the same or corresponding numerals, and a description thereof will be omitted as appropriate.

Figure 1:
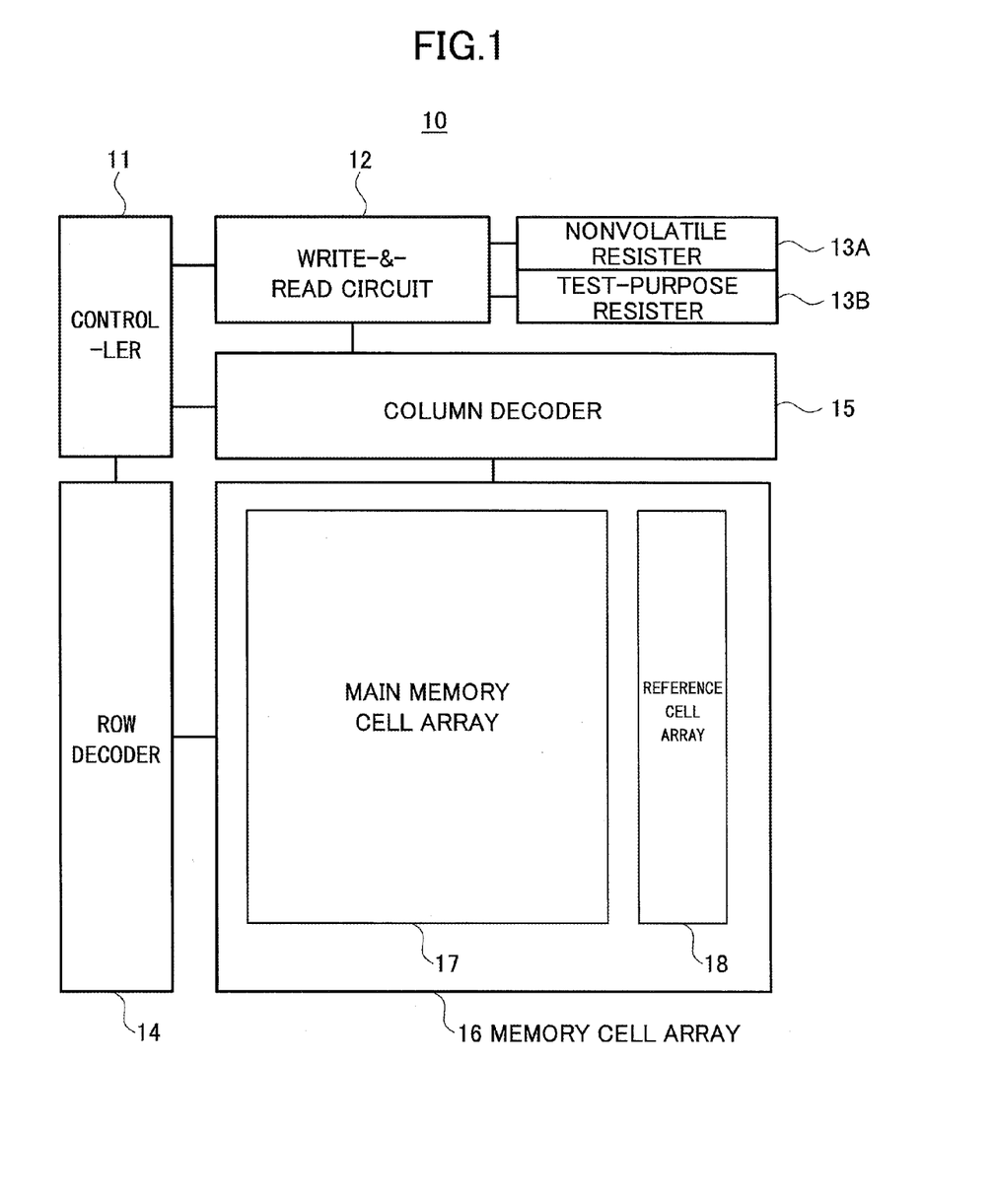
FIG. 1 is a drawing illustrating an example of the configuration of a semiconductor memory device.

FIG. 1 is a drawing illustrating an example of the configuration of a semiconductor memory device. A semiconductor memory device 10 of FIG. 1 includes a controller 11, a write-&-read circuit 12, a nonvolatile resister 13A, a test-purpose resister 13B, a row decoder 14, a column decoder 15, and a memory cell array 16. In FIG. 1, boundaries between functional or circuit blocks illustrated as boxes basically indicate functional boundaries, and may not correspond to separation in terms of physical positions, separation in terms of electrical signals, separation in terms of control logic, etc. Each functional or circuit block may be a hardware module that is physically separated from other blocks to some extent, or may indicate a function in a hardware module in which this and other blocks are physically combined together.

The memory cell array 16 includes a main memory cell array 17 and a reference cell array 18. The main memory cell array 17 has a plurality of memory cells arranged in rows and columns, and also has circuits and interconnection lines for specifying addresses and transferring data for the purpose of reading and writing one-bit data with respect to each memory cell. In the case of an MRAM, a magnetic tunnel junction device serves as a memory element constituting a memory cell. In the case of a flash memory, an field-effect transistor having a floating gate serves as a memory element constituting a memory cell.

The controller 11 receives a clock signal and control signals from an external source to generate various internal control signals, thereby controlling the operations and operating timing of each unit of the semiconductor memory device 10. The controller 11 decodes a command specified by the control signals, and generates the internal control signals at the timing responsive to the clock signal. Namely, the controller 11 supplies clock signals and timing signals for internal control purposes to the individual units of the semiconductor memory device 10 to ensure that these units operate with appropriate timing. This arrangement causes data write and data read operations to be performed in the semiconductor memory device 10.

The row decoder 14 decodes a row address among the addresses supplied from an external source, and selectively activates a word line corresponding to the row address. The column decoder 15 decodes a column address among the addresses supplied from an external source, and selectively activates a column line corresponding to the column address. As a result, the corresponding column transistor becomes conductive, so that a selected bit line of the main memory cell array 17 is coupled to the write-&-read circuit 12. The write-&-read circuit 12 performs a data write operation or a data read operation with respect to the memory cell selected by the activated word line and the activated column line.

In the following, the configuration and operation of the memory cell array 16 will be described by taking an MRAM as an example. It may be noted, however, that the semiconductor memory device to which the configuration of the present disclosures is applicable is not limited to an MRAM. Any type of semiconductor memory device may suffice as long as the device stores information therein by creating a change in the resistance value of a memory cell.

Figure 2:
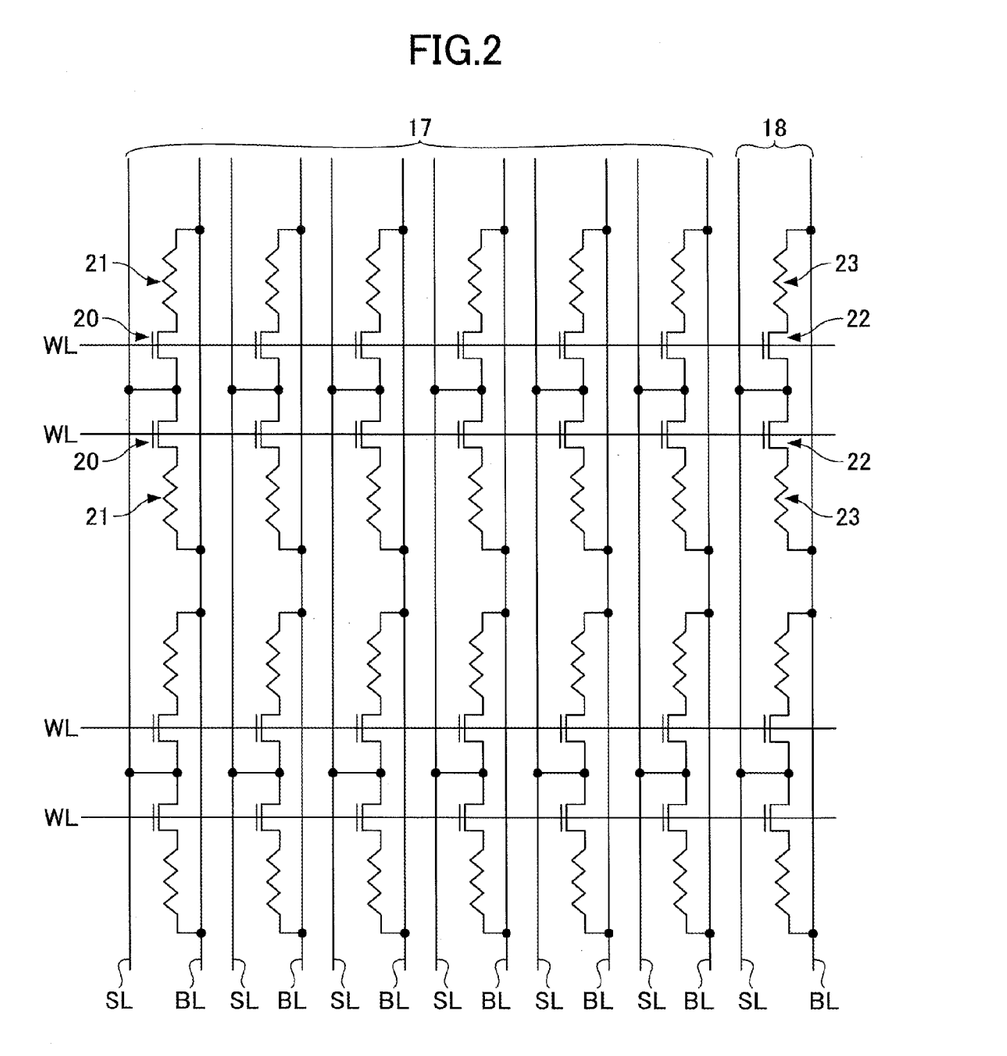
FIG. 2 is a drawing illustrating an example of the circuit configuration of a main memory cell array and a reference cell array.

FIG. 2 is a drawing illustrating an example of the circuit configuration of the main memory cell array 17 and the reference cell array 18. In FIG. 2, the same or corresponding elements as those of FIG. 1 are referred to by the same or corresponding numerals, and a description thereof will be omitted as appropriate.

In the main memory cell array 17, memory cells each including a cell transistor 20 and a magnetic tunnel junction device 21 are arranged in rows and columns. One end of the magnetic tunnel junction device 21 is connected to a source line SL through the cell transistor 20, which is placed in either the ON state or the OFF state under the control of a word line WL. The other end of the magnetic tunnel junction device 21 is connected to a bit line BL. This bit line BL is coupled through the column decoder 15 to the write-&-read circuit 12 as previously described.

In the reference cell array 18, reference cells each including a cell transistor 22 and a magnetic tunnel junction device 23 are arranged in a line. One end of the magnetic tunnel junction device 23 is connected to a source line SL through the cell transistor 22, which is placed in either the ON state or the OFF state under the control of a word line WL. The other end of the magnetic tunnel junction device 23 is connected to a bit line BL. This bit line BL is coupled to the write-&-read circuit 12.

The write-&-read circuit 12 causes electric currents to flow through the memory cell selected by the column address and the row address and through the reference cell selected by the row address, respectively. The sense amplifier of the write-&-read circuit 12 compares a voltage responsive to the voltage drop across the memory cell with a voltage responsive to the voltage drop across the reference cell to detect the data stored in the memory cell.

Figure 3:
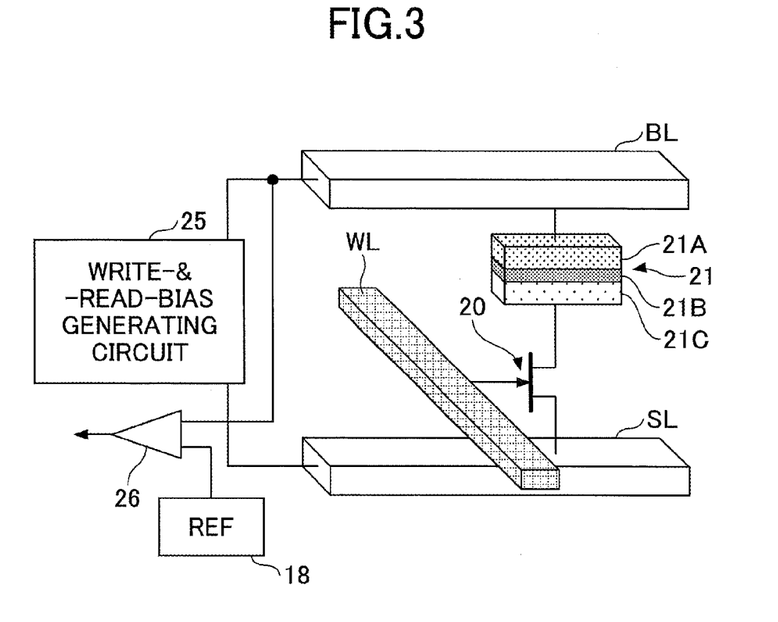
FIG. 3 is an illustrative drawing for explaining a write operation and a read operation with respect to a spin-transfer torque MRAM.

FIG. 3 is an illustrative drawing for explaining a write operation and a read operation with respect to a spin-transfer torque MRAM. In FIG. 3, the same or corresponding elements as those of FIG. 2 are referred to by the same or corresponding numerals, and a description thereof will be omitted as appropriate.

The magnetic tunnel junction device 21 includes a free layer 21A, a barrier layer 21B, and a fixed layer 21C. As was previously described, one end of the magnetic tunnel junction device 21 is connected to the source line SL through the cell transistor 20, which is placed in either the ON state or the OFF state under the control of the word line WL. The other end of the magnetic tunnel junction device 21 is connected to the bit line BL. The bit line is coupled to a write-&-read-bias generating circuit 25 and to a sense amplifier 26 through the column decoder 15 illustrated in FIG. 1. The column decoder 15 is omitted from illustration in FIG. 3. The write-&-read-bias generating circuit 25 and the sense amplifier 26 may be part of the write-&-read circuit 12. The sense amplifier 26 compares a voltage responsive to the voltage drop across the magnetic tunnel junction device 21 with a voltage responsive to the voltage drop across the magnetic tunnel junction device 23 to detect the data stored in the memory cell.

At the time of a write operation, the write-&-read-bias generating circuit 25 applies voltage to the magnetic tunnel junction device 21 to write data of either "0" or "1". The direction in which the write-&-read-bias generating circuit 25 applies voltage is changed to change the direction in which a current flows through the magnetic tunnel junction device 21, thereby controlling whether the write data is "0" or "1".

Figure 4A:
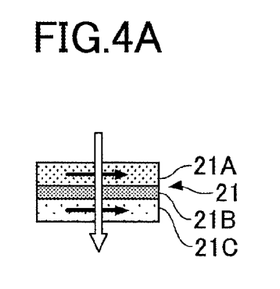
FIGS. 4A through 4C are illustrative drawings for explaining a write operation and a read operation.
Figure 4B:
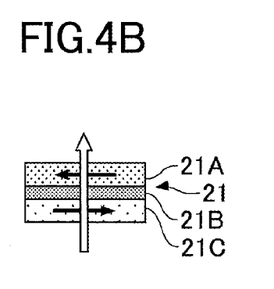
Figure 4C:
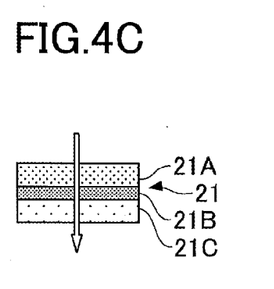
Figure 5:
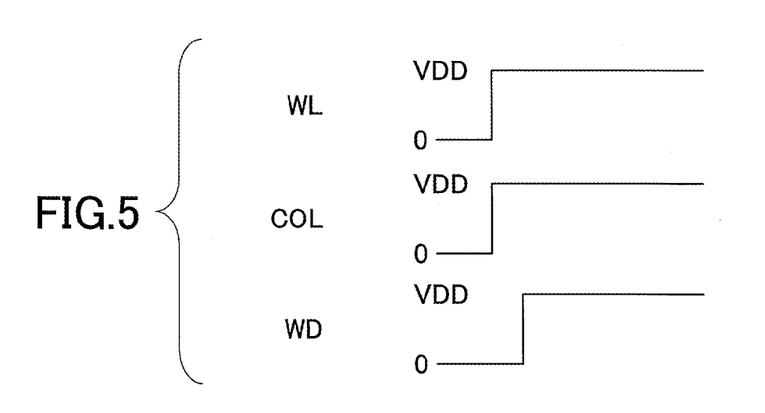
FIG. 5 is a drawing illustrating the waveforms of signals used at the time of a write operation.
Figure 6:
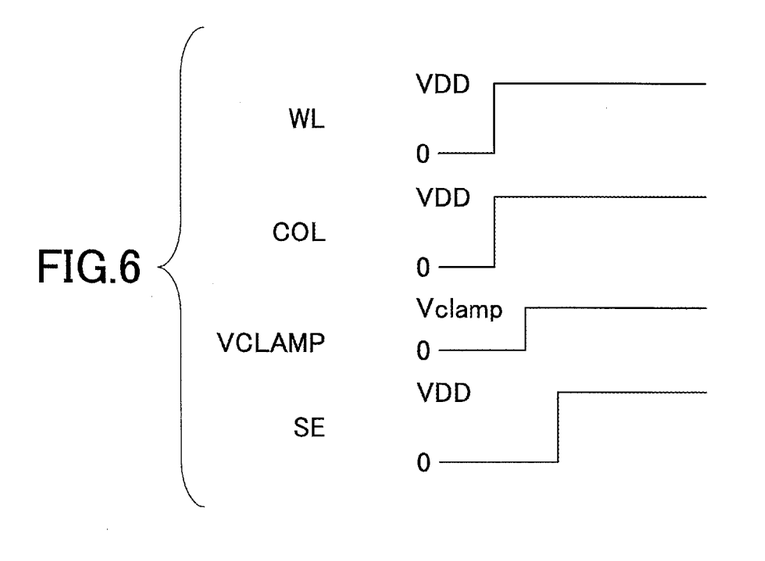
FIG. 6 is a drawing illustrating the waveforms of signals used at the time of a read operation.

FIGS. 4A through 4C are illustrative drawings for explaining a write operation and a read operation. FIG. 5 is a drawing illustrating the waveforms of signals used at the time of a write operation. FIG. 6 is a drawing illustrating the waveforms of signals used at the time of a read operation. A write operation and a read operation will be described by referring to FIG. 3 through FIG. 6.

At the time of a write operation, the word line WL and a column activation signal COL are set to a power supply voltage VDD as illustrated in FIG. 5 to couple the magnetic tunnel junction device 21 to the write-&-read-bias generating circuit 25. The write-&-read-bias generating circuit 25 applies a write signal WD whose level is equal to the power supply voltage VDD (e.g., 1.2 V) to the magnetic tunnel junction device 21. At this time, applying voltage in such a manner as to cause a current to flow in the direction indicated by an arrow in FIG. 4A causes the directions of electron spins to be parallel to each other between the free layer 21A and the fixed layer 21C. As a result, the resistance value of the magnetic tunnel junction device 21 becomes relatively small, which means that data "0" is stored therein. Further, applying voltage in such a manner as to cause a current to flow in the direction indicated by an arrow in FIG. 4B causes the directions of electron spins to be opposite to each other between the free layer 21A and the fixed layer 21C. As a result, the resistance value of the magnetic tunnel junction device 21 becomes relatively large, which means that data "1" is stored therein.

At the time of a read operation, the word line WL and a column activation signal COL are set to a power supply voltage VDD as illustrated in FIG. 6 to couple the magnetic tunnel junction device 21 to the write-&-read-bias generating circuit 25. The write-&-read-bias generating circuit 25 further sets a clamp signal VCLAMP to a voltage Vclamp, and also sets a sense-amplifier activating signal SE to the power supply voltage VDD to activate the sense amplifier 26 (see FIG. 3). The clamp signal VCLAMP and the sense-amplifier activating signal SE will be described later. The clamp signal VCLAMP that is applied to the gate of a clamp transistor embedded in the write-&-read-bias generating circuit 25 is set to the voltage Vclamp, so that the voltage applied to the magnetic tunnel junction device 21 becomes equal to the voltage Vclamp minus a threshold voltage. This arrangement serves to limit the amount of current flowing through the magnetic tunnel junction device 21 to no more than the amount of current used at the time of a write operation, thereby allowing a data read operation to be performed while avoiding spin reversal. Namely, the sense amplifier 26 compares a voltage responsive to the voltage drop across the magnetic tunnel junction device 21 with a voltage responsive to the voltage drop across the magnetic tunnel junction device 23 to detect the data stored in the memory cell. Data "0" is read in the case of the resistance value of the magnetic tunnel junction device 21 being relatively small. Data "1" is read in the case of the resistance value of the magnetic tunnel junction device 21 being relatively large.

Figure 7:
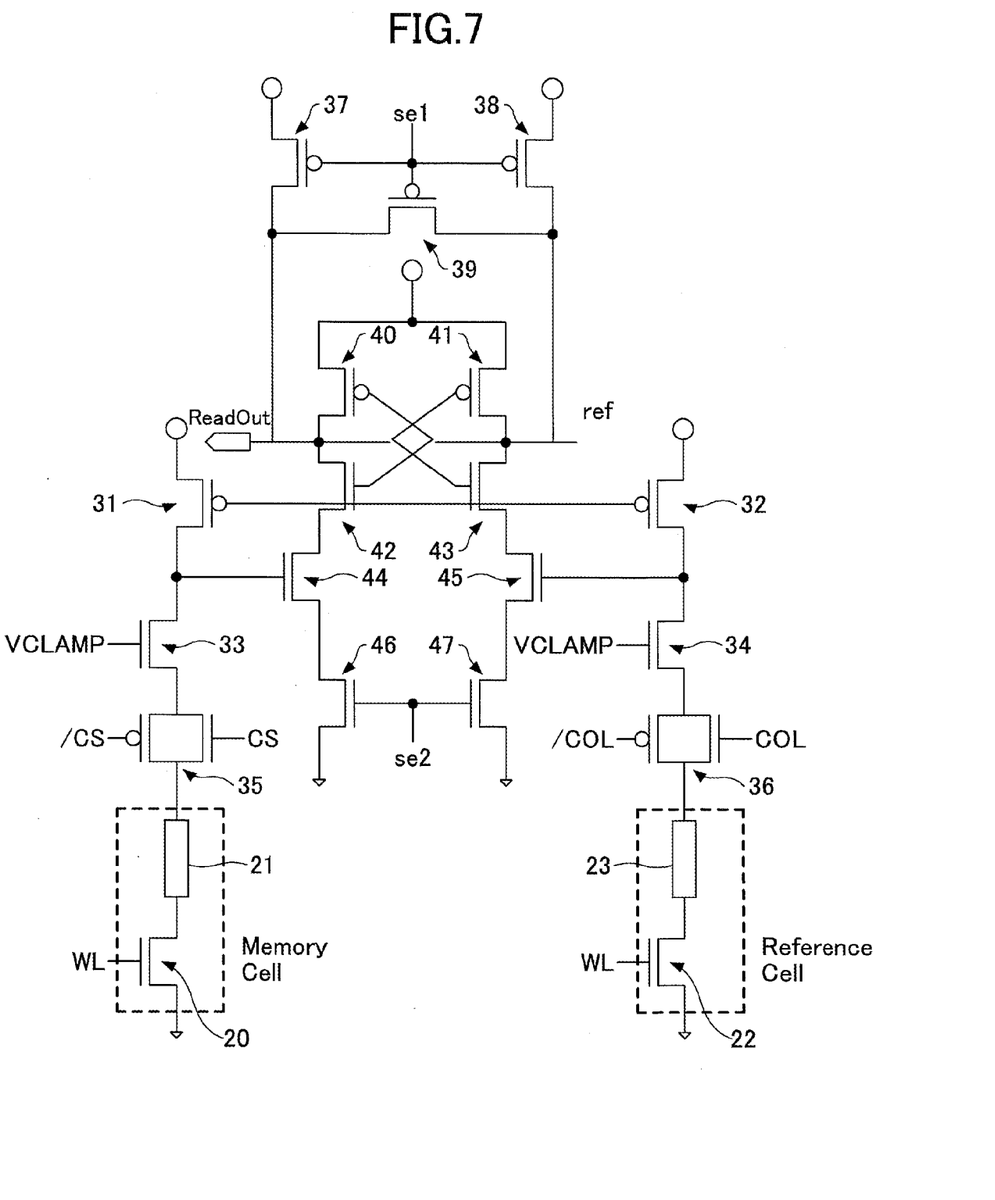
FIG. 7 is a drawing illustrating an example of the circuit configuration of a sense amplifier and the periphery thereof.

FIG. 7 is a drawing illustrating an example of the circuit configuration of a sense amplifier and the periphery thereof. The sense amplifier illustrated in FIG. 7 includes PMOS transistors 37 through 41 and NMOS transistors 42 through 47. Signals se1 and se2 correspond to the sense-amplifier activating signal SE previously described. Upon these signals becoming HIGH, the sense amplifier is activated to perform a sensing operation. The PMOS transistors 31 and 32 and the NMOS transistors 33 and may be part of the write-&-read-bias generating circuit 25. Transfer gates 35 and 36 may be part of the column decoder 15.

A PMOS transistor 31 is a first current source that causes a first current to flow through a memory cell including the magnetic tunnel junction device 21 and the cell transistor 20. A PMOS transistor 32 is a second current source with variable current amount that causes a second current to flow through a reference cell including the magnetic tunnel junction device 23 and the cell transistor 22. The sense amplifier compares a voltage (i.e., the voltage at the gate of the NMOS transistor 44) responsive to the voltage drop across the memory cell with a voltage (i.e., the voltage at the gate of the NMOS transistor 45) responsive to the voltage drop across the reference cell. The result of comparison is output as ReadOut (and ref).

A column signal CS is generated based on the column activation signal COL and a column address. The column signal CS is provided on a column-by-column basis (i.e., on a bit-line-by-bit-line basis). The column signal CS corresponding to the column specified by a column address is set to HIGH upon the column activation signal COL changing to HIGH. At the time of a write operation and a read operation, the transfer gates 35 and 36 become conductive, so that the memory cell and the reference cell are coupled to the PMOS transistors 31 and 32, respectively, serving as the respective current sources. During a read operation, as previously described, the clamp signal VCLAMP applied to the gates of the clamp transistors 33 and 34 is set to the voltage Vclamp, so that the voltage applied to the magnetic tunnel junction devices 21 and 23 become equal to the voltage Vclamp minus a threshold voltage. This ensures that a cap is placed on the amount of current to avoid the occurrence of spin reversal during a data read operation.

Figure 8:
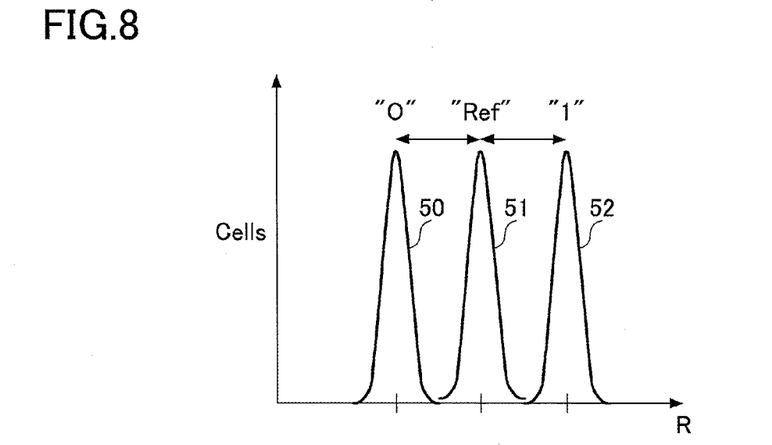
FIG. 8 is a drawing illustrating an example of the ideal distribution of resistance values of a magnetic tunnel junction device.

FIG. 8 is a drawing illustrating an example of the ideal distribution of resistance values of a magnetic tunnel junction device. In FIG. 8, the horizontal axis represents the resistance value, and the vertical axis represents the number of memory cells. When data "0" is written to a large number of memory cells, the numbers of memory cells having respective resistance values exhibit a distribution as illustrated by a distribution curve 50. When data "1" is written to a large number of memory cells, the numbers of memory cells having respective resistance values exhibit a distribution as illustrated by a distribution curve 52. A distribution curve 51 illustrates a distribution of the numbers of reference cells having respective resistance values. In an ideal situation, as illustrated in FIG. 8, the resistance value at the center of the distribution of reference cells indicated by the distribution curve 51 is preferably a midpoint value between the resistance value at the center of the distribution indicated by the distribution curve 50 and the resistance value at the center of the distribution indicated by the distribution curve 52.

The magnetic tunnel junction device 23 of a reference cell is designed to have an area size larger than the area size of the magnetic tunnel junction device 21 of a memory cell. The area size of the magnetic tunnel junction device 23 of a reference cell is set such that the resistance value of the reference cell placed in the high-resistance state (i.e., opposite spin state) is equal to a midpoint resistance value between the high resistance value and the low resistance value of the memory cell.

As illustrated in FIG. 2, a single word line WL is connected to a plurality of memory cells (e.g., 256 memory cells), all of which are compared with a common reference cell connected to the same word line WL. A magnetic tunnel junction device is a minute device, and, thus, accurately manufacturing the device having a desired area size is fraught with difficulties. Accordingly, it is difficult in reality to set the resistance value of a reference cell accurately to the midpoint value between the high resistance value and the low resistance value of a memory cell.

Figure 9:
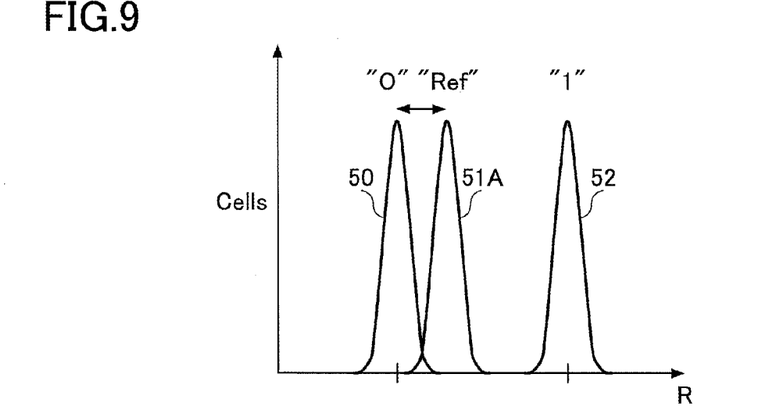
FIG. 9 is a drawing illustrating an example of the distribution of resistance values of a magnetic tunnel junction device.

FIG. 9 is a drawing illustrating an example of the distribution of resistance values of a magnetic tunnel junction device. In FIG. 9, the horizontal axis represents the resistance value, and the vertical axis represents the number of memory cells. In the example illustrated in FIG. 9, the effect of manufacturing errors or the like causes a distribution curve 51A indicative of the distribution of reference cells having respective resistance values to have resistance values lower than the ideal resistance values. Namely, the resistance value at the center of the distribution of reference cells indicated by the distribution curve 51A is lower that the midpoint value between the resistance value at the center of the distribution indicated by the distribution curve 50 and the resistance value at the center of the distribution indicated by the distribution curve 52. In this state, the read margin is narrow, resulting in a lengthy time required to read and detect data, which may create a risk of failing to detect the data within a predetermined time period. Further, a memory cell close to the right-hand-side end of the distribution curve 50 has a resistance value that is higher than the resistance value of a reference cell situated close to the left-hand-side end of the distribution curve 51A. In this case, the read data ends up being detected as data "1" despite the fact that the read data is actually data "0".

The PMOS transistor 32 serving as the current source on the reference cell side illustrated in FIG. 7 is configured to allow the current amount thereof to be variably set. This current source with variable current amount adjusts the amount of current flowing through a reference cell to achieve proper settings to the voltages for comparison such that the voltage of the reference cell is situated at the midpoint between the voltage of data "0" and the voltage of data "1".

Figure 10:
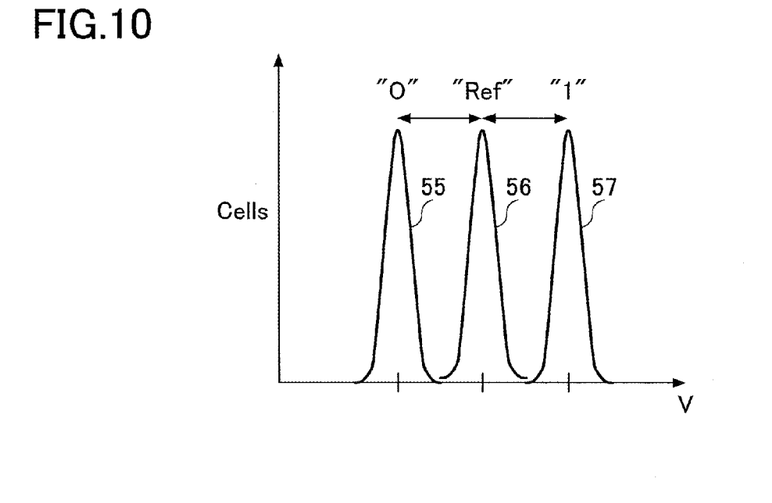
FIG. 10 is a drawing illustrating a distribution of memory cells with respect to voltages applied at the time of reading.

FIG. 10 is a drawing illustrating a distribution of memory cells with respect to voltages applied at the time of reading. In FIG. 10, the horizontal axis represents read voltage levels (or voltage drops of respective cells) that are subjected to comparison by the sense amplifier at the time of reading, and the vertical axis represents the number of memory cells. When data "0" is written to a large number of memory cells, the numbers of memory cells having respective read voltage levels exhibit a distribution as illustrated by a distribution curve 55. When data "1" is written to a large number of memory cells, the numbers of memory cells having respective read voltage levels exhibit a distribution as illustrated by a distribution curve 57. A distribution curve 56 illustrates a distribution of the numbers of reference cells having respective read voltage levels. The read voltage at the center of the distribution of reference cells indicated by the distribution curve 56 is equal to the midpoint between the read voltage at the center of the distribution indicated by the distribution curve 55 and the read voltage at the center of the distribution indicated by the distribution curve 57. This is the ideal condition. Even when the reference cells exhibit the characteristics as illustrated in FIG. 9, the amount of current flowing through a reference cell at the time of a read operation is increased to raise the read voltage level, thereby properly performing a read operation in the ideal condition as illustrated in FIG. 10.

Figure 11:
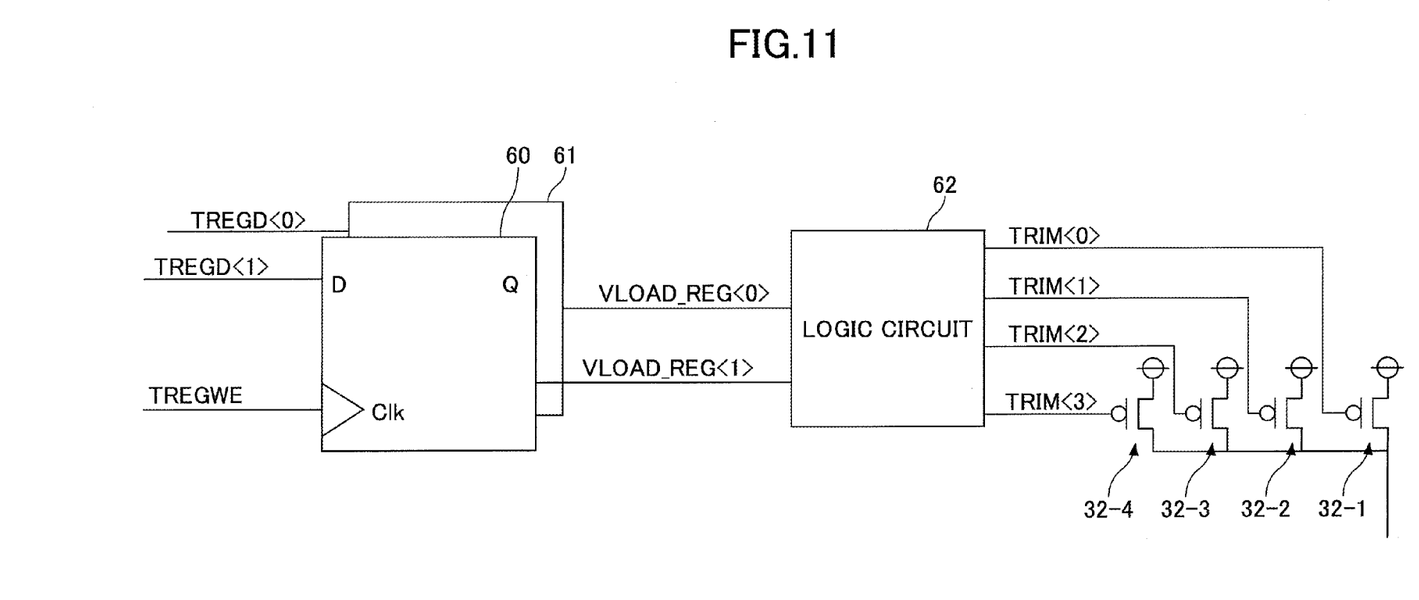
FIG. 11 is a drawing illustrating an example of the circuit configuration of the current source for a reference cell and the circuit for setting the amount of current.

FIG. 11 is a drawing illustrating an example of the circuit configuration of the current source for a reference cell and the circuit for setting the amount of current. The circuit illustrated in FIG. 11 includes flip-flops 60 and 61, a logic circuit 62, and PMOS transistors 32-1 through 32-4. The PMOS transistors 32-1 through 32-4 correspond to the PMOS transistor 32 illustrated in FIG. 7. When the gate width of the PMOS transistor 31 illustrated in FIG. 7 is 1 micrometers, for example, the gate width of the PMOS transistor 32-1 may be 0.8 micrometers, and the respective gate widths of the remaining PMOS transistors 32-2 through 32-4 may be 0.2 micrometers, for example. During the read operation, the PMOS transistor 32-1 is placed in the conductive state all the time, and the remaining PMOS transistors 32-2 through 32-4 are placed either in the conductive state or in the nonconductive state to adjust the amount of current supplied to a reference cell.

In this manner, the current source for a reference cell includes a plurality of MOS transistors 32-1 through 32-4 connected in parallel to each other and connected in series to the reference cell. The amount of current of the current source is determined in response to the number of MOS transistors that are placed in the conductive state among the MOS transistors 32-1 through 32-4. The PMOS transistor side and the NMOS transistor side may be swapped in the circuit illustrated in FIG. 7. In such a case, NMOS transistors may be used as current sources. Further, the number of MOS transistors connected in parallel to each other is not limited to four, and may be any number that is two or more. Moreover, there is no need for all the remaining MOS transistors other than the one MOS transistor to have the same gate width. These MOS transistors may have respective, different gate widths.

Which of the PMOS transistors 32-1 through 32-4 are placed in the conductive state is controlled by outputs TRIM<0> through TRIM<3> of the logic circuit 62. The logic circuit 62 generates the outputs TRIM<0> through TRIM<3> in response to inputs VLOAD___REG<O> and VLOAD___REG<1> from the flip-flops 60 and 61. VLOAD___REG<O> and VLOAD___REG<1> output from the flip-flops 60 and 61 are equal to signals TREGD<0> and TREGD<1> that are loaded to the flip-flops 60 and 61 in response to a trigger signal TREGWE. It may be noted that the flip-flops 60 and 61 correspond to the test-purpose resister 13B illustrated in FIG. 1.

Figure 12:
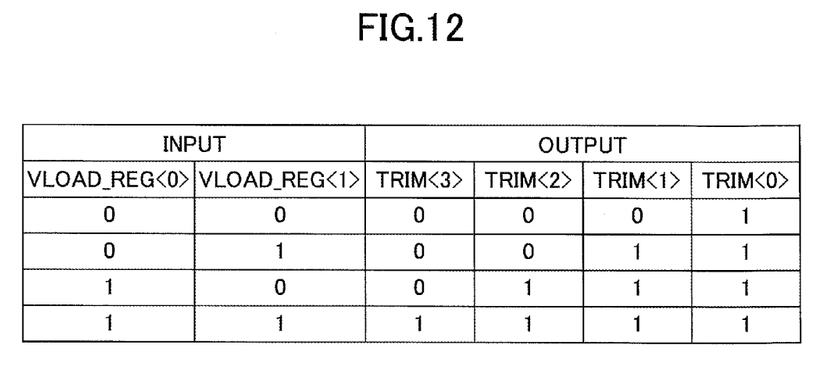
FIG. 12 is a truth table illustrating the input-output relationship of a logic circuit.

FIG. 12 is a truth table illustrating the input-output relationship of the logic circuit 62. As illustrated in FIG. 12, the output TRIM<0> is "1" (i.e., HIGH) at all times. The number of signals being "1" (i.e., HIGH) among the outputs TRIM<1> through TRIM<3> is equal to the number specified by a binary number expressed by VLOAD___REG<O> and VLOAD___REG<1>.

Figure 13:
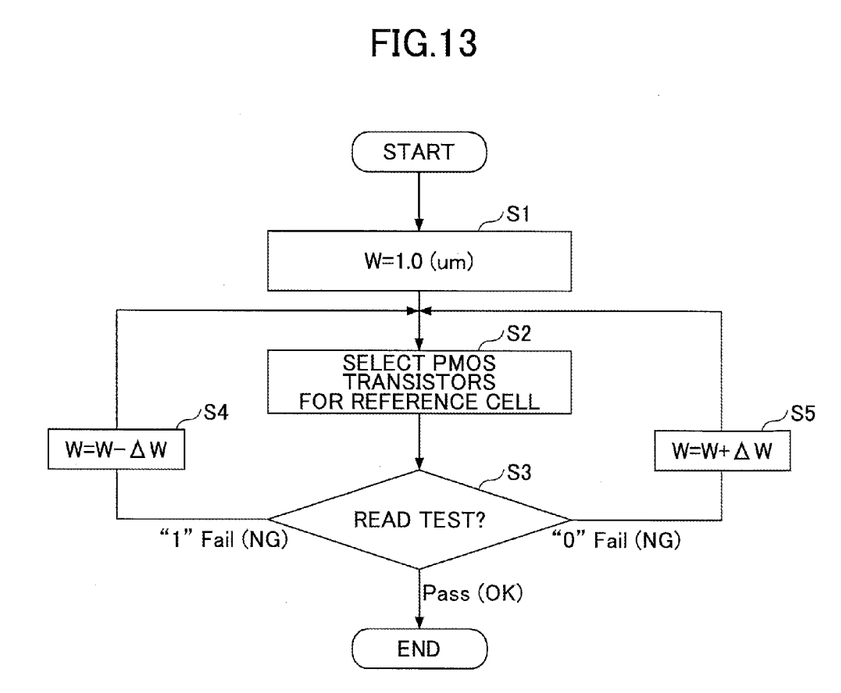
FIG. 13 is a flowchart illustrating the steps of a procedure of adjusting the amount of read current with respect to a reference cell.

FIG. 13 is a flowchart illustrating the steps of a procedure of adjusting the amount of read current with respect to a reference cell. A test is performed prior to the shipment of the semiconductor memory device 10 from factory. The adjustment of the amount of current as illustrated in FIG. 13 is performed in this pre-shipment test.

Upon the start of the test, in step S1, the controller 11 sets the value of the test-purpose resister 13B such that an equivalent gate width W is equal to 1.0 micrometers. Namely, the controller 11 sets the values of the flip-flops 60 and 61 such that VLOAD___REG<0> and VLOAD___REG<1> are "0" and "1", respectively. As a result, in step S2, the PMOS transistors 32-1 and 32-2 illustrated in FIG. 11 are placed in the conductive state, resulting in the equivalent gate width W being 1.0 micrometers.

In step S3, an external tester performs a read test with respect to the semiconductor memory device 10. Specifically, data "0" is written, and is subsequently read to check by use of the external tester whether or not the read data is "0". Further, data "1" is written, and is subsequently read to check by use of the external tester whether or not the read data is "1". Namely, a first current is caused to flow through a memory cell after writing to the memory cell, and a second current is caused to flow through a reference cell, followed by comparing a voltage responsive to the voltage drop across the memory cell with a voltage responsive to the voltage drop across the reference cell to output the resultant data, and then utilizing the external tester to check whether the data is correct or erroneous. This test is performed with respect to all addresses. Thereafter, the amount of the second current flowing through a reference cell is adjusted in response to the result of the comparison as will be described below.

In the case that the reading of data "1" fails in the test performed in step S3, the procedure proceeds to step S4. In step S4, a command is input into the semiconductor memory device 10 by use of the external tester, such that the controller 11 decreases the equivalent gate width in response to the command. Namely, the amount of the second current flowing through a reference cell is reduced. In the example illustrated in FIG. 11, the equivalent gate width W is reduced by 0.2 micrometers. The procedure then goes back to step S2 to repeat the subsequent steps.

In the case that the reading of data "0" fails in the test performed in step S3, the procedure proceeds to step S5. In step S5, a command is input into the semiconductor memory device 10 by use of the external tester, such that the controller 11 increases the equivalent gate width in response to the command. Namely, the amount of the second current flowing through a reference cell is raised. In the example illustrated in FIG. 11, the equivalent gate width W is increased by 0.2 micrometers. The procedure then goes back to step S2 to repeat the subsequent steps.

When all the memory cells pass the test performed in step S3, the procedure comes to an end. Upon the completion of the procedure or prior to the completion, the controller 11 writes to the nonvolatile resister 13A the same data that is stored in the test-purpose resister 13B. Namely, the data indicative of the adjusted amount of current is stored in the nonvolatile resister. The nonvolatile register may be an EEPROM (electrically erasable programmable read-only memory) such as a flash memory, a fuse or the like.

When a normal memory operation is to be performed after shipment, the controller 11 and the write-&-read circuit 12 supply the data stored in the nonvolatile resister 13A to the logic circuit 62, thereby performing a read operation using the amount of current that is set by the pre-shipment test. Namely, the data stored in the nonvolatile resister 13A is used to specify the one or more MOS transistors that are placed in the conductive state among the plurality of MOS transistors.

In the tests described above, the amount of read current flowing through a reference cell is adjusted based on the correctness or incorrectness of read data such that all the read data are correctly obtained. This is only an example of an adjustment operation. Provision may be made such that the amount of current flowing through a reference cell may be adjustable over a wide range. Then, a gate width W1 with which the probability of reading data "0" correctly is 50% and a gate width W2 with which the probability of reading data "1" correctly is 50% may be obtained. The gate width may then be set equal to the midpoint between W1 and W2.

In the following, a description will be given of the result of confirming the advantage of current adjustment by use of a circuit simulation. In this simulation, the read circuit supplies read currents from PMOS transistor current sources to a memory cell and a reference cell, respectively, and compares the signal voltages of these cells by use of a latch-type sense amplifier to detect data.

A magnetic tunnel junction device having a diameter of 50 nm was used as a memory cell where an MgO film having an RA of 7 $\Omega\mu m^2$ was used with the resistance being R and the area size being A. In the case of the MR ratio being set equal to 100% in such a magnetic tunnel junction device, the low resistance value corresponding to data "0" was equal to 3.6 k$\Omega$, and the high resistance value corresponding to data "1" was equal to 7.2 k$\Omega$. The magnetic tunnel junction device used for a reference cell utilized an MgO film having an RA of 7 $\Omega\mu m^2$ the same as that of the memory cell, with the area size thereof being set larger than that of the magnetic tunnel junction device of the memory cell, and was placed in the high-resistance state.

Figure 14:
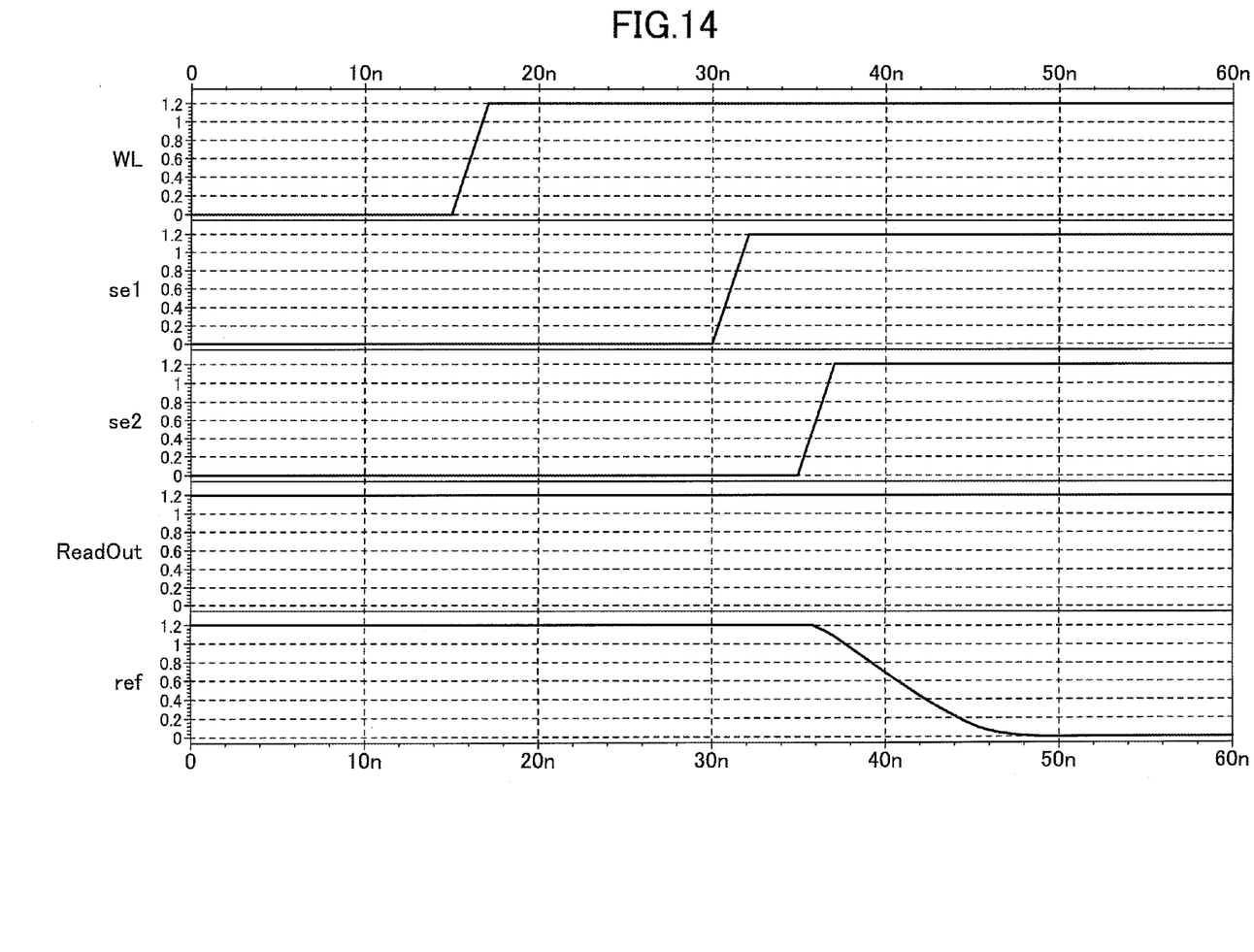
FIG. 14 is a drawing illustrating simulation waveforms in the case in which the resistance value of a reference cell is the ideal value.

FIG. 14 is a drawing illustrating simulation waveforms in the case in which the resistance value of a reference cell is the ideal value. In this simulation, a magnetic tunnel junction device having a diameter of 58 nm was used as a reference cell, and was placed in the high resistance state to provide 5.4 k$\Omega$ that was the midpoint resistance value between data "0" and data "1". In this case, the activation of the word line WL and the sense-amplifier activating signals se1 and se2 illustrated in FIG. 7 caused the read data ReadOut and ref to be immediately fixed at proper voltage levels.

Figure 15:
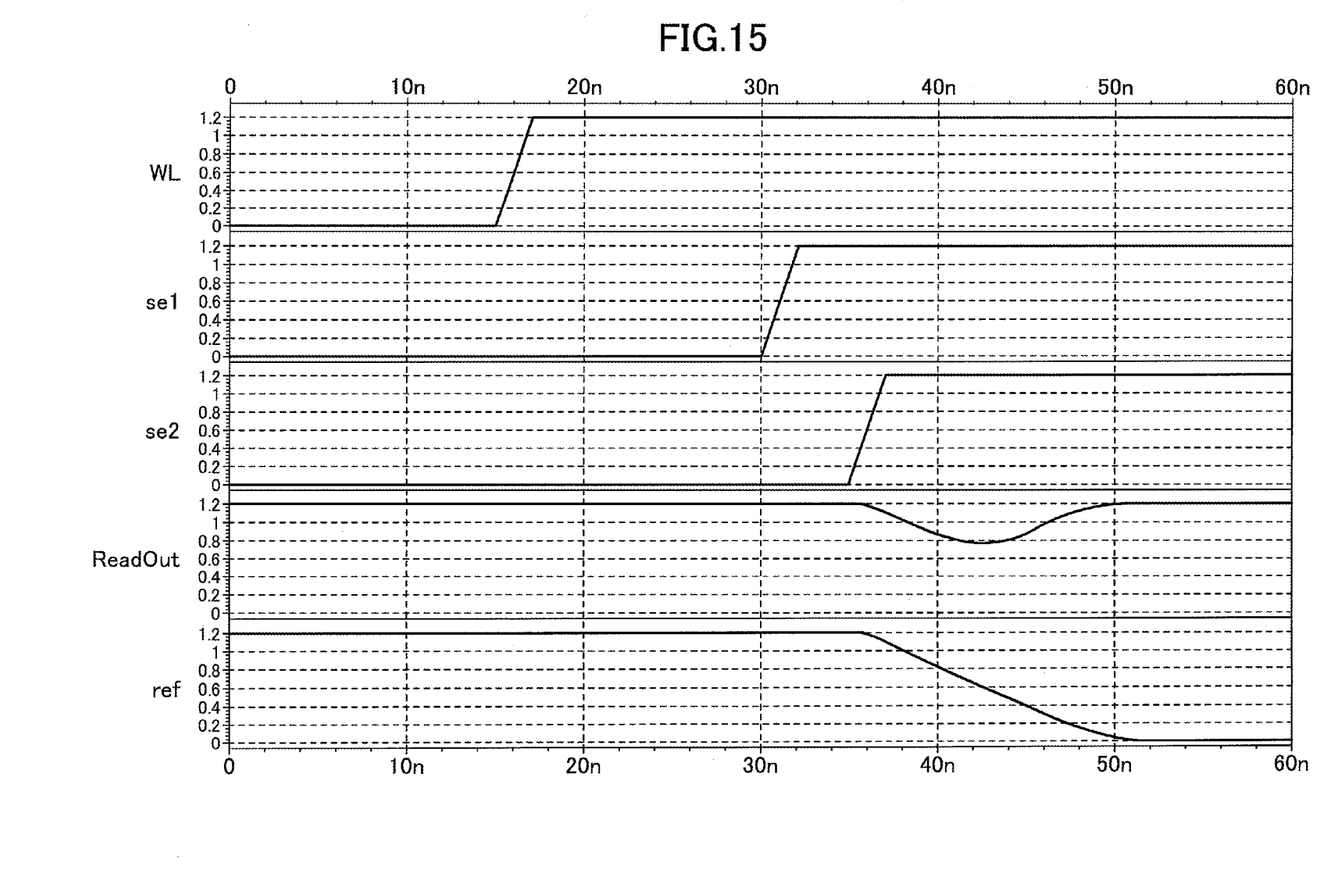
FIG. 15 is a drawing illustrating simulation waveforms in the case in which the resistance value of a reference cell is deviated from the ideal value.

FIG. 15 is a drawing illustrating simulation waveforms in the case in which the resistance value of a reference cell is deviated from the ideal value. In this simulation, the resistance value of the magnetic tunnel junction device of a reference cell was set equal to 3.7 k$\Omega$. In this case, upon the activation of the word line WL and the sense-amplifier activating signals se1 and se2 illustrated in FIG. 7, it took a lengthy time for the read data ReadOut and ref to be fixed at proper voltage levels. Under the actual operating conditions, a read error may occur because of the time limitation.

Figure 16:
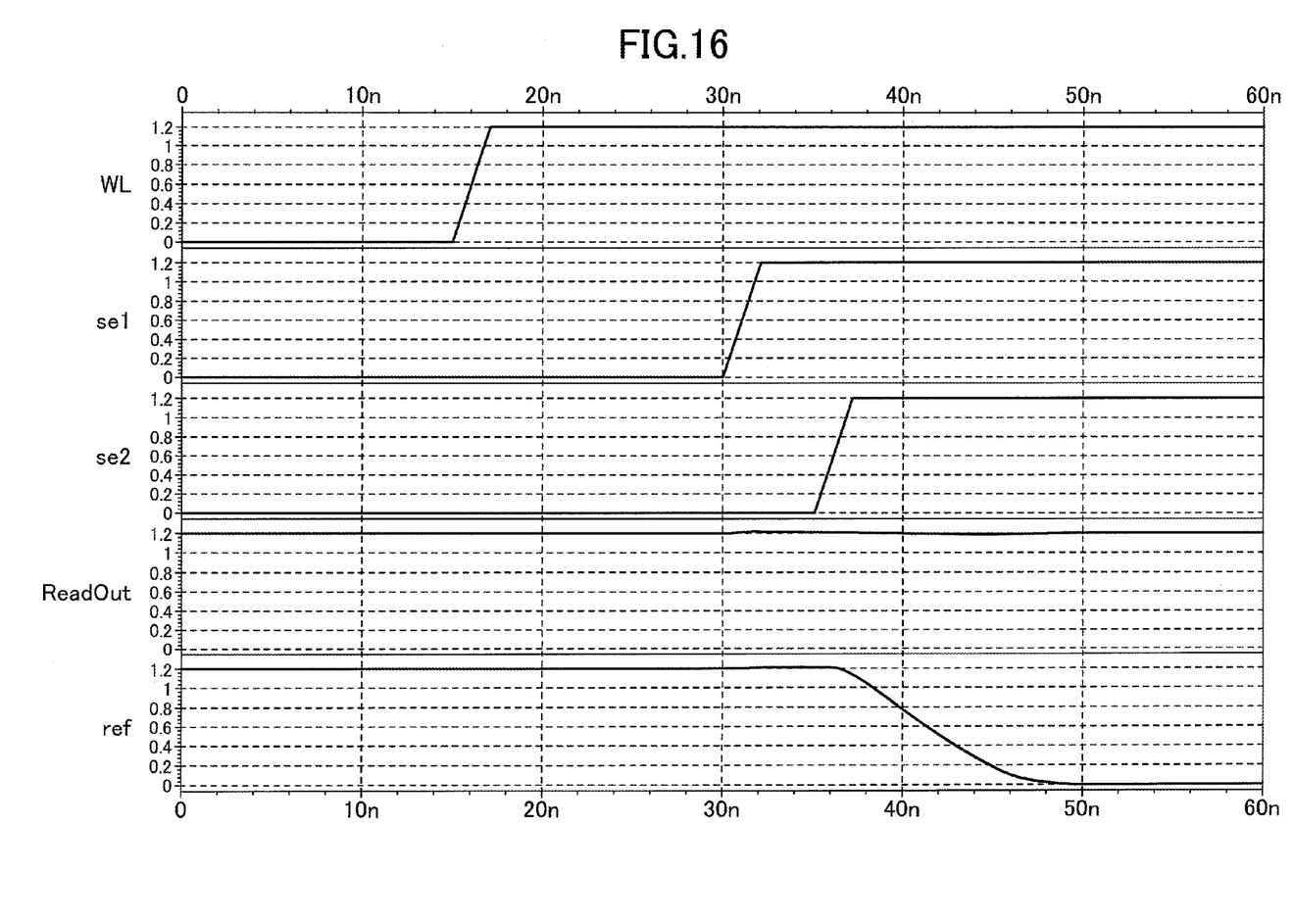
FIG. 16 is a drawing illustrating simulation waveforms in the case in which the resistance value of a reference cell is deviated from the ideal value, but the amount of current is adjusted.

FIG. 16 is a drawing illustrating simulation waveforms in the case in which the resistance value of a reference cell is deviated from the ideal value, but the amount of current is adjusted. In this simulation, the resistance value of the magnetic tunnel junction device of a reference cell was set equal to 3.7 k$\Omega$. However, the gate width W of the PMOS transistor serving as the reference-cell-side current source was changed from a standard value of 1.0 $\mu$m to an adjusted value of 1.2 $\mu$m. In this case, the activation of the word line WL and the sense-amplifier activating signals se1 and se2 illustrated in FIG. 7 caused the read data ReadOut and ref to be immediately fixed at proper voltage levels similarly to the manner illustrated in FIG. 14.

According to at least one embodiment, data reading is properly performed even when the resistance value of a reference cell is deviated from the midpoint resistance value. Specifically, the read current of a reference cell is adjusted to set the read voltage to an appropriate level, thereby ensuring a sufficient read margin.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:
1. A semiconductor memory device, comprising:
a memory cell;
a reference cell;
a first current source configured to cause a first current to flow through the memory cell;
a second current source configured to cause a second current having an amount thereof being variable to flow through the reference cell;
a sense amplifier configured to compare a voltage responsive to a voltage drop across the memory cell with a voltage responsive to a voltage drop across the reference cell; and
a current-amount setting circuit configured to determine the amount of the second current, wherein the current-amount setting circuit determines the amount of the second current such that the voltage drop across the reference cell is set equal to a midpoint between the voltage drop across the memory cell having a data value of "0" stored therein and the voltage drop across the memory cell having a data value of "1" stored therein, and wherein the second current source includes a plurality of MOS transistors connected in parallel to each other and each series-connected to the reference cell, wherein the amount of the second current is determined in response to a number of one or more MOS transistors that are placed in a conductive state among the plurality of MOS transistors.

2. The semiconductor memory device as claimed in claim 1, wherein the current-amount setting circuit is a nonvolatile resister, which has data stored therein that specifies the one or more MOS transistors that are placed in the conductive state among the plurality of MOS transistors.

3. The semiconductor memory device as claimed in claim 1, wherein each of the memory cell and the reference cell is a spin-transfer torque magnetoresistive random access memory including a magnetic tunnel junction device.

4. The semiconductor memory device as claimed in claim 3, wherein the magnetic tunnel junction device of the reference cell has an area size larger than that of the magnetic tunnel junction device of the memory cell, and is placed in a high-resistance state.

5. A method of controlling a semiconductor memory device, comprising:

causing a first current to flow through a memory cell;

causing a second current to flow through a reference cell;

comparing a voltage responsive to a voltage drop across the memory cell with a voltage responsive to a voltage drop across the reference cell;

adjusting an amount of the second current in response to a result of the comparing; and storing data indicative of the adjusted amount in a nonvolatile resister, wherein the adjusting an amount of the second current includes adjusting a number of MOS transistors placed in a conductive state among a plurality of MOS transistors that are connected in parallel to each other and series-connected to the reference cell.

* * * * *